(12) United States Patent
Ahiko et al.

(10) Patent No.: US 6,407,907 B1
(45) Date of Patent: Jun. 18, 2002

(54) MULTILAYER CERAMIC CAPACITOR

(75) Inventors: Taisuke Ahiko, Akita-ken; Takaya Ishigaki, Tokyo, both of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/612,524

(22) Filed: Jul. 6, 2000

(30) Foreign Application Priority Data

Dec. 28, 1999 (JP) .............................................. 11-374828

(51) Int. Cl.$^7$ ......................... H01G 4/228; H01G 4/236; H01G 2/20
(52) U.S. Cl. .................. 361/306.3; 361/307; 361/308.1
(58) Field of Search ........................... 361/301.1, 301.4, 361/302, 303, 304, 305, 306.1–306.3, 307, 308.1, 308.2, 308.3, 309, 310, 311–312, 320, 321.1–321.6, 328–330

(56) References Cited

U.S. PATENT DOCUMENTS

| | | | | |
|---|---|---|---|---|
| 5,061,686 A | * | 10/1991 | Ruby ............................. 565/1 |
| 5,369,545 A | | 11/1994 | Bhattacharyya et al. |
| 5,400,210 A | * | 3/1995 | Sugimoto et al. ........ 361/321.5 |
| 5,657,199 A | * | 8/1997 | Devoe et al. ................ 361/328 |
| 5,745,334 A | * | 4/1998 | Hoffarth et al. ............ 361/313 |
| 5,880,925 A | | 3/1999 | Dupre et al. |
| 6,034,864 A | * | 3/2000 | Naito et al. ............... 361/306.1 |
| 6,038,121 A | * | 3/2000 | Naito et al. ................ 361/303 |
| 6,072,687 A | * | 6/2000 | Naito et al. ................ 361/303 |
| 6,072,690 A | * | 6/2000 | Farooq et al. ........... 361/321.2 |
| 6,188,565 B1 | * | 2/2001 | Naito et al. ................ 361/303 |
| 6,215,647 B1 | * | 4/2001 | Naito et al. ................ 361/303 |

FOREIGN PATENT DOCUMENTS

| JP | 6-267790 | 9/1994 |
|---|---|---|
| JP | 6-275463 | 9/1994 |
| JP | 7-169649 | 7/1995 |

* cited by examiner

Primary Examiner—Dean A. Reichard
Assistant Examiner—Eric W. Thomas
(74) Attorney, Agent, or Firm—Oliff & Berridge, PLC (57) ABSTRACT

A multilayer capacitor having a hexagonally-shaped capacitor body, a first internal electrode arranged therein, and a second internal electrode arranged below the first internal electrode separated by a ceramic layer. The capacitor body is provided with a first through-hole electrode passing through the second non-contact hole, of the second internal electrode and electrically connected to the first internal electrode and a second through-hole electrode passing through the first non-contact hole of the first internal electrode and electrically connected to the second internal electrode in columnar shapes extending to intersect the internal electrodes. The first through-hole electrode is electrically connected to the first external electrodes arranged in island shapes at the upper and lower flat portions. The second through-hole electrode is electrically connected to the second external electrodes arranged in island shapes at the surfaces of the capacitor body.

5 Claims, 9 Drawing Sheets

MULTILAYER CERAMIC CAPACITOR

BACKGROUND OF THE INVENTION

1. Field of the Invention

The present invention relates to a multilayer capacitor designed to reduce the equivalent serial inductance (ESL), more particularly relates to a multilayer ceramic chip capacitor enabling three-dimensional mounting.

2. Description of the Related Art

Capacitors have conventionally been broadly used as one type of electronic device. Due to the demands for high density mounting etc. in recent years, compact multilayer ceramic chip capacitors have also come into use.

A general multilayer ceramic chip capacitor has for example a capacitor body formed in a rectangular parallelopiped shape and internal electrodes alternately superposed to face each other inside the body. The internal electrodes are designed to be able to obtain an electrostatic capacity due to the ceramic layer positioned between them. The two ends of the capacitor body in the longitudinal direction are formed with terminal electrodes. These terminal electrodes are connected to the alternately arranged internal electrodes. The internal electrodes are connected to the terminal electrodes in an manner extending in a perpendicular direction.

Further, known in the art are multilayer ceramic chip capacitors such as three-terminal through-hole type capacitors and flip-type capacitors which reduce the parasitic inductance and the ESL by means of the internal structure and the arrangement of terminal electrodes. Even a multilayer ceramic chip capacitor reduced in ESL however has internal electrodes connected to the terminal electrodes in a form extending in the perpendicular direction.

In recent years, the increase in the operating frequency accompanying higher speeds of operation of CPUs has meant that even multilayer ceramic chip capacitors lowered in ESL in use up to now sometimes have too large a parasitic inductance. Further, conventional multilayer ceramic chip capacitors have all been connected to the boards by soldering, so that the capacitors have had the defect that the inductances of the lands between devices ended up becoming larger.

On the other hand, along with the increase in the operating frequency of CPUs, when the equivalent serial resistance (ESR) in an electronic device is large, the heat buildup of the electronic device itself becomes large and therefore the heat buildup becomes a problem.

Note that as shown in Japanese Unexamined Patent Publication (Kokai) No. 6-275463, Japanese Unexamined Patent Publication (Kokai) No. 6-267790, and Japanese Unexamined Patent Publication (Kokai) No. 7-169649, multilayer through-hole type capacitor arrays having through-hole electrode structures have been proposed. In the capacitor arrays described in these publications, while through-hole type electrodes are disclosed, adjoining external electrodes are the same polarity (ground terminal is provided at the body end), the flows of currents at the through-hole terminals and ground terminals do not act to cancel each other out, so that there is the problem that reduction of the ESL is difficult.

Further, the magnitude of the ESR of a capacitor having a through-hole electrode structure is determined by the width, length, and number of columnar internal electrodes due to the through-holes and the state of connection between the internal electrodes and external electrodes. Further, in general, columnar electrodes are easily roughened due to problems in production, therefore there is the defect that the junctions with the external electrodes become unstable and the ESR tends to become large.

SUMMARY OF THE INVENTION

An object of the present invention is to provide a multilayer capacitor designed to reduce the ESL even more and enable three-dimensional mounting.

To achieve the object, the multilayer capacitor of the present invention comprises a planar first internal electrode arranged in a capacitor body formed by stacking dielectric layers; a planar second internal electrode arranged facing the first internal electrode separated by the dielectric layer in the capacitor body; a first through-hole electrode connected with said first internal electrode and passing through a second non-contact hole of said second internal electrode while extending to intersect both of the internal electrodes; a second through-hole electrode connected with said second internal electrode and passing through a first non-contact hole of said first internal electrode while extending to intersect both of the internal electrodes; first external electrodes connected to said first through-hole electrode and arranged in island shapes on two surfaces of the capacitor body; and second external electrodes connected to said second through-hole electrode and arranged in island shapes on two surfaces of the capacitor body.

According to the multilayer capacitor of the present invention, the first external electrodes and second external electrodes are arranged on flat portions forming surfaces of the capacitor body. The two types of the first and second through-hole electrodes connected respectively to the two types of internal electrodes extend in columnar shapes into the thickness direction of the body from the external electrodes. Further, these two types of through-hole electrodes alternately become positive and negative polarities at the time of carrying a current and act as electrodes for the two types of internal electrodes arranged in parallel in this capacitor.

The multilayer capacitor according to the present invention is used as a smoothing capacitor for an IC power source. It is buried in a multilayer board of a three-dimensional structure for a microprocessing unit (MPU) and is connected from the top and bottom. Further, the IC power source has a Vcc terminal and a GND terminal. High frequency currents flow in opposite directions to lands arranged three-dimensionally in the board.

Therefore, the magnetic fields cancel each other out due to the high frequency currents flowing in the opposite directions, so that the loop inductance of the board is reduced. Further, there is naturally the effect that the lengths of the lands themselves become shorter due to making the board three-dimensional.

On the other hand, inside the multilayer capacitor as well, two types of columnar through-hole electrodes provide the above three-dimensional effect of the magnetic fields canceling each other out due to the high frequency currents flowing in opposite directions. Further, since the positive and negative currents intersect two-dimensionally between the two types of internal electrodes, the parasitic inductance of the multilayer capacitor itself is sharply reduced.

Due to the above, in the capacitor according to the present invention, the two types of through-hole electrodes are formed in columnar shapes and are connected alternately to the two types of internal electrodes, so that it is able to be mounted three-dimensionally on a board. Also, it is possible to reduce the loop inductance of the board itself three-dimensionally and reduce the parasitic inductance of the multilayer capacitor itself not only two-dimensionally, but also three-dimensionally by the effect of cancellation of the magnetic fields.

In the present invention, preferably the first external electrodes and second external electrodes are arranged on the surfaces of the capacitor body so that the first external electrodes and the second external electrodes are next to each other and a plurality of lines of these external electrodes are arranged. In this case, since a plurality of first external electrodes and second external electrodes are arranged next to each other, the effect of the magnetic fields canceling each other out due to the high frequency currents flowing in opposite directions is further enhanced.

In the present invention, preferably the capacitor body is formed in a hexagonal shape; first terminal electrodes connected to said first internal electrode are formed at least at three side faces of the capacitor body; and second terminal electrodes connected to said second internal electrode are formed at least at three side faces of the capacitor body.

In this case, lead electrodes of the facing internal electrodes are lead out alternately to at least three side faces. Further, in the same way as a conventional capacitor array with terminal electrodes arranged at the side faces, terminal electrodes are arranged at the side faces of the body and the internal electrodes led to the terminal electrodes are connected. Therefore, external electrodes and terminal electrodes are formed on all six faces of the multilayer capacitor made a rectangular parallelopiped and therefore not only three-dimensional mounting, but also two-dimensional mounting becomes possible. As a result, when supplying high frequency currents to the terminal electrodes so that the terminal electrodes of the side faces alternately become positive and negative and supplying high frequency currents to the two types of external electrodes to become alternately positive and negative, opposite currents flow to the columnar through-hole electrodes. Therefore, the currents intersect so that the two types of internal electrodes connected to the terminal electrodes and through-hole electrodes become positive and negative polarities and as a result the parasitic inductance further falls and the ESR and ESL can be further reduced.

In the present invention, preferably the first through-hole electrode and the second through-hole electrode are formed by nickel or a nickel alloy. By using a shrink-resistant nickel-based metal with a low specific resistance as the material of the through-hole electrodes, it becomes possible to maintain good junctions with the internal electrodes and keep the ESR low.

In the present invention, preferably the first internal electrode and the second internal electrode are formed by nickel or a nickel alloy. By making not only the material of the through-hole electrodes, but also the material of the internal electrodes a nickel-based metal, the junction property between the through-hole electrodes and the internal electrodes becomes higher and the ESR can be kept lower much more reliably.

BRIEF DESCRIPTION OF THE DRAWINGS

These and other objects and features of the present invention will be explained in further detail with reference to the attached drawings, in which.

DESCRIPTION OF THE PREFERRED EMBODIMENTS

First Embodiment

Next, an explanation will be made of a first embodiment of a multilayer capacitor according to the present invention with reference to the drawings.

Figure 1:
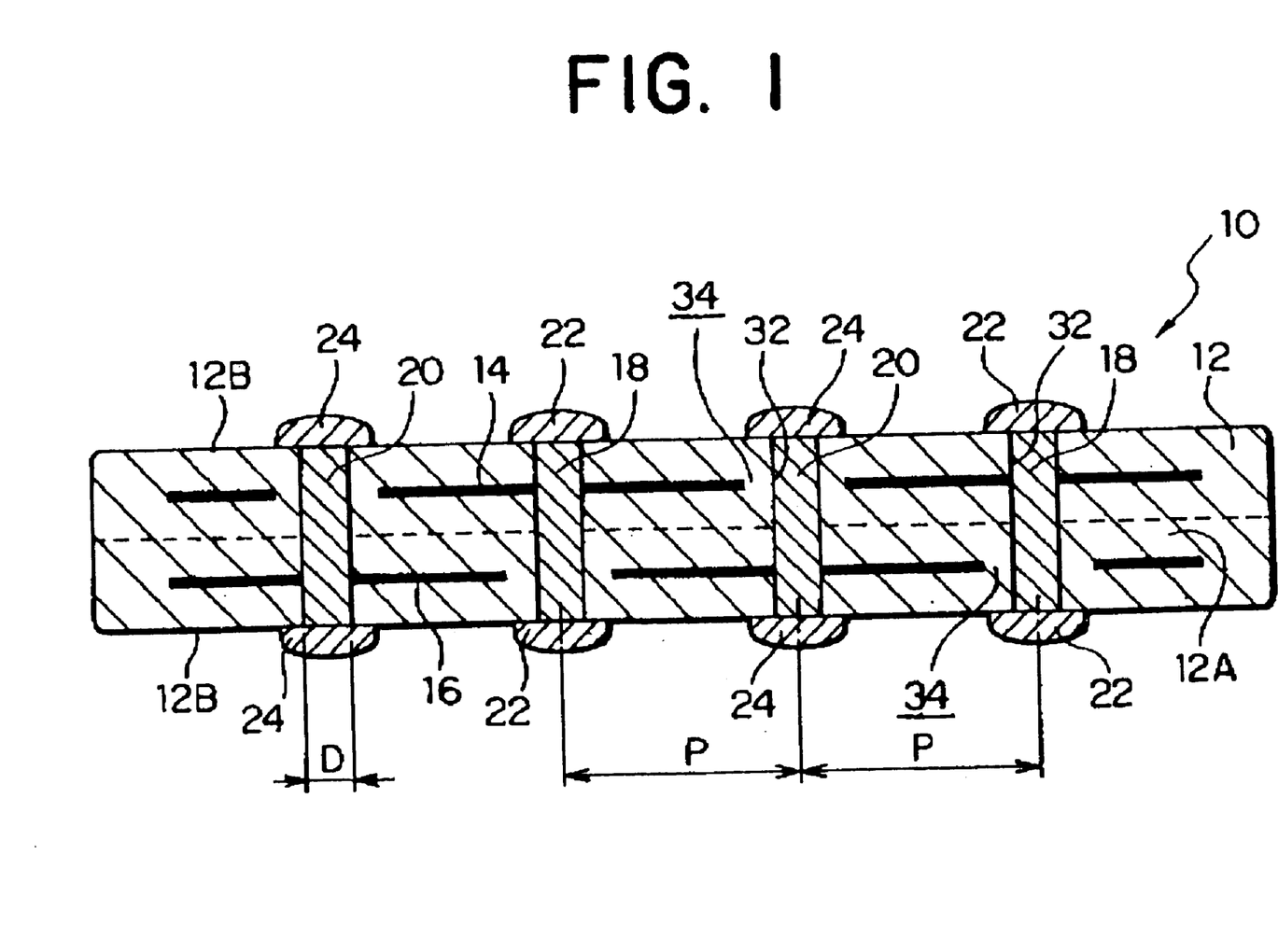
FIG. 1 is a sectional view of a multilayer ceramic chip capacitor according to a first embodiment of the present invention taken along the line I—I of FIG. 3.
Figure 2:
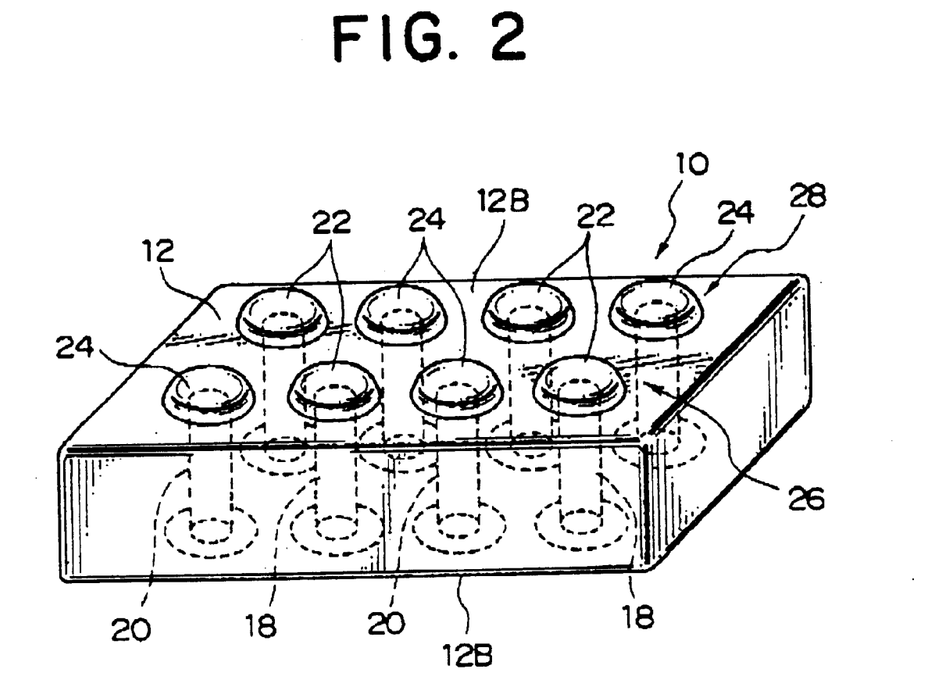
FIG. 2 is a perspective view of the multilayer ceramic chip capacitor according to the first embodiment of the present invention.

The multilayer capacitor according to the first embodiment of the present invention, that is, the three-dimensionally mountable multilayer ceramic chip capacitor 10, is shown in FIG. 1 and FIG. 2. As shown in these figures, a multilayer ceramic chip capacitor 10 is comprised of a rectangular parallelepiped shaped sintered body obtained by stacking a plurality of ceramic green sheets for forming dielectric layers and firing the stack, that is, a capacitor body 12.

A planar first internal electrode 14 is arranged at a certain height (thickness direction of body 12) position in the capacitor body 12. Similarly, a planar second internal electrode 16 is arranged under the first internal electrode 14 separated by a ceramic layer 12A in the capacitor body 12. Therefore, the first internal electrode 14 and second internal electrode 16 are arranged facing each other at a distance through the dielectric layer in the capacitor body 12.

The centers of the first internal electrode 14 and second internal electrode 16 are arranged at substantially the same position as the center of the capacitor body 12. Further, the longitudinal and lateral dimensions of the first internal electrode 14 and the second internal electrode 16 are somewhat smaller than the corresponding lengths of the sides of the capacitor body 12, so that the ends of the first internal electrode 14 and second internal electrode 16 are not exposed at the ends of the capacitor body 12.

In the capacitor body 12, first through-hole electrodes 18 passing through second non-contact holes 34 of the second internal electrode 16 and electrically connected to the first internal electrode 14 and the second through-hole electrodes 20 passing through first non-contact holes 34 of the first internal electrode 14 and electrically connected to the second internal electrode 16 are provided in columnar shapes in forms extending perpendicularly intersecting these internal electrodes 14 and 16. Further, the internal electrodes 14 and 16 and the through-hole electrodes 18 and 20 are formed by a nickel-based metal.

As shown in FIG. 2, a first line is formed by having first through-hole electrodes 18 and second through-hole electrodes 20 alternately arranged two by two at the portion near the front of the capacitor body 12 in the illustration. A second line where first through-hole electrodes 18 and second through-hole electrodes 20 alternately arranged two by two parallel to the first line and in an opposite arrangement is similarly arranged at the portion near the rear of the capacitor body 12 adjoining the first line.

These first through-hole electrodes 18 are electrically connected to first external electrodes 22 arranged in island shapes at the upper and lower flat portions 12B forming surfaces of the capacitor body 12. Further, these second through-hole electrodes 20 are electrically connected to second external electrodes 24 arranged in island shapes at the surfaces of the capacitor body 12.

That is, a first line 26 is formed by having first external electrodes 22 and second external electrodes 24 alternately arranged two by two at the portion near the front of the capacitor body 12 in the illustration. A second line 28 where first external electrodes 22 and second external electrodes 24 are alternately arranged two by two parallel to the first line 26 and in an opposite arrangement to the first line 26 is similarly arranged at the portion near the rear of the capacitor body 12 adjoining the first line 26. Therefore, a plurality of lines of these external electrodes 22 and 24 are alternately arranged in a zigzag form at the surfaces of the capacitor 12 so that the first external electrodes 22 and the second external electrodes 24 are arranged adjoining each other.

Next, an explanation will be made of the production of the multilayer ceramic chip capacitor 10 according to the present embodiment based on FIG. 3.

First, at the time of production of the multilayer ceramic chip capacitor 10, a plurality of ceramic green sheets 30A, 30B, 30C, and 30D comprised of dielectric materials functioning as capacitors are prepared.

Figure 3:
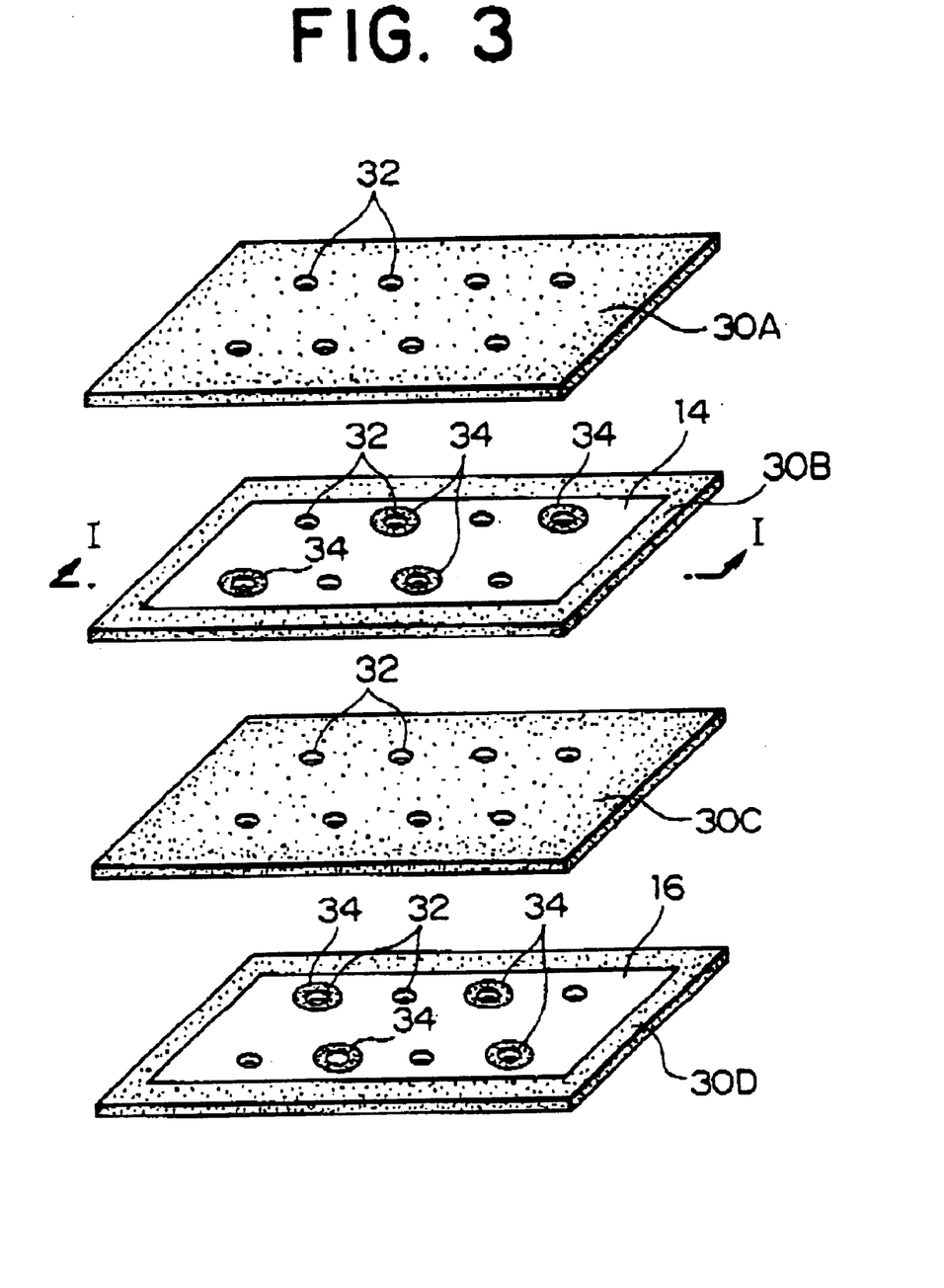
FIG. 3 is a disassembled perspective view showing the plurality of ceramic green sheets and the shapes of the electrodes used in the process of production of the multilayer ceramic chip capacitor of the first embodiment.

As shown in FIG. 3, the ceramic green sheet 30B is positioned below the ceramic green sheet 30A without electrodes printed or deposited on its upper surface. To form the first internal electrode 14 on this ceramic green sheet 30B, for example a conductive paste is printed or deposited in accordance with the pattern of the first internal electrode 14.

Further, the ceramic green sheet 30C without electrodes printed or deposited on its upper surface is positioned below the ceramic green sheet 30B. The ceramic green sheet 30D is positioned below the ceramic green sheet 30C. To form the second internal electrode 16 on the upper surface of the ceramic green sheet 30D, a conductive paste is similarly printed or deposited in accordance with the pattern of the second internal electrode 16.

These ceramic green sheets 30A, 30B, 30C, and 30D are provided with a total of eight through-holes 32 at the same positions. Further, the internal electrodes 14 and 16 of the ceramic green sheets 30B and 30D are alternately provided with non-contact holes 34 so as not to contact the through-holes 32.

That is, non-contact holes 34 coaxial with the through-holes 32 and of a diameter larger than these through-holes 32 are formed around the through-holes 32 at the far left and the third position from the left in the line arranged at the front side of the first internal electrode 14. Further, non-contact holes 34 coaxial with the through-holes 32 and of a diameter larger than these through-holes 32 are formed around the through-holes 32 at the second position from the left and the fourth position from the left in the line arranged at the rear side of the first internal electrode 14. Further, the second internal electrode 16 is formed with non-contact holes 34 in the same way as above around the through-holes 32 at positions corresponding to ones where non-contact holes 34 are not provided in the first internal electrode 14.

Further, the ceramic green sheets 30A, 30B, 30C, and 30D with rectangular planar shapes are stacked and fired together to obtain a capacitor body 12. A paste mainly comprised of nickel metal is then spread to connect the through-holes 32 with the locations without non-contact holes 34 of the internal electrodes 14 and 16. As a result, the first through-hole electrodes 18 and the second through-hole electrodes 20 are formed.

Finally, the external electrodes 22 and 24 are formed at the two flat portions 12B of the capacitor body 12. At this time, it is possible to use plating or to use single metals such as Ag and Cu. Further, various types of external electrodes 22 and 24 may be used depending on the method of connection to the board.

Next, an explanation will be made of an example of use of the multilayer ceramic chip capacitor 10 using a modification of the above embodiment.

Figure 4:
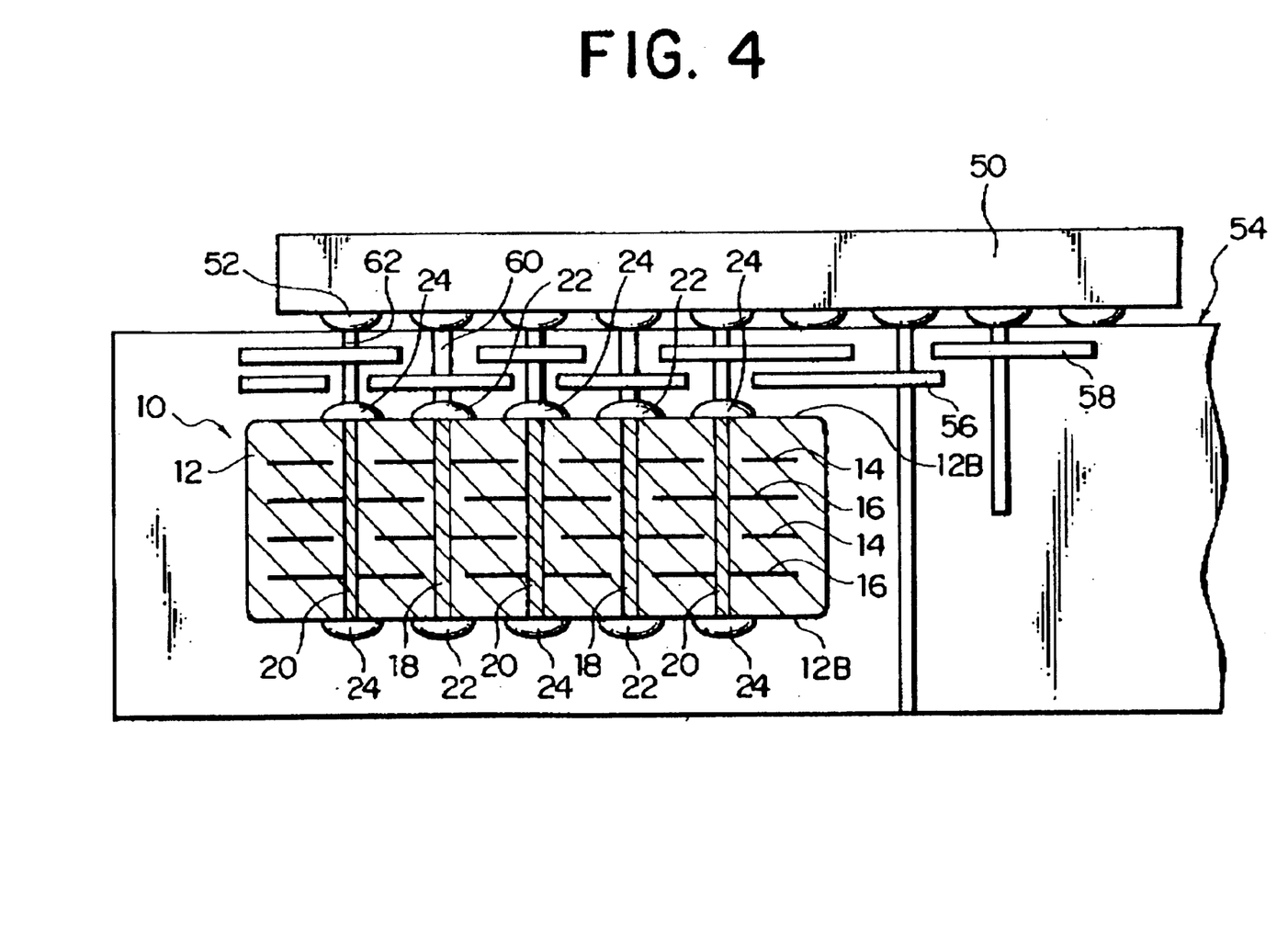
FIG. 4 is a sectional view of the state of use of the multilayer ceramic chip capacitor according to a modification of the first embodiment.

The capacitor of this modified embodiment is structured with pairs of the first internal electrodes 14 and second internal electrodes 16, that is, a total of four internal electrodes 14 and 16, arranged alternately in the capacitor body 12. The first through-hole electrodes 18 passing through the non-contact holes of the two second internal electrodes 16 and electrically connected to the two first internal electrodes 14 and the second through-hole electrodes 20 passing through the non-contact holes of the two first internal electrodes 14 and electrically connected to the two second internal electrodes 16 are provided in columnar shapes in manners extending perpendicularly intersecting the internal electrodes 14 and 16.

On the other hand, the arrangement of the first through-hole electrodes 18 and the second through-hole electrodes 20 and the arrangement of the first external electrodes 22 and the second external electrodes 24 are similar to those of the embodiment shown from FIG. 1 to FIG. 3, so explanations will be omitted. As shown in FIG. 4, however, the distance between the external electrodes 22 and 24 of the modified embodiment is made to match the distance between BGA terminals 52 of an MPU or other IC 50.

The capacitor of this modified embodiment is a three-dimensional mountable type in the same way as the multilayer ceramic chip capacitor 10 shown from FIG. 1 to FIG. 3 and, from its product characteristics, is used in a manner buried in a multilayer board of a three-dimensional structure for an MPU shown in FIG. 4 as a smoothing capacitor for an IC power source. The IC power source has a not shown Vcc terminal and GND terminal and is designed so that high frequency currents flow in opposite directions at the lands 56 and 58 arranged three-dimensionally in the board 54.

As a result, the terminal Vcc and first external electrode 22 are connected through the land 56 and via-hole 60, the GND terminal and second external electrode 24 are connected through the land 58 and the via-hole 62, and a high frequency current flows from the Vcc terminal and the GND terminal into the multilayer ceramic chip capacitor 10.

Next, an explanation will be given of the action of the multilayer ceramic chip capacitor 10 according to the present embodiment.

Planar first internal electrodes 14 and second internal electrodes 16 are arranged alternately facing each other separated by ceramic layers 12A inside a capacitor body 12 formed by stacking ceramic or other dielectric layers. Further, first through-hole electrodes 18 passing through non-contact holes of the second internal electrodes 16 and connected to the first internal electrodes 14 and second through-hole electrodes 20 passing through the non-contact holes of the first internal electrodes 14 and connected to the second internal electrodes 16 extend intersecting the internal electrodes 14 and 16.

Further, the first external electrodes 22 connected to the first through-hole electrodes 18 and the second external electrodes 24 connected to the second through-hole electrodes 20 are arranged in island shapes at the two flat portions 12B of the capacitor body 12.

That is, four first external electrodes 22 and second external electrodes 24 are respectively arranged in a zigzag manner at the flat portions 12B forming the surfaces of the capacitor body 12. Further, two types of through-hole electrodes 18 and 20 each connected to one of the two types of internal electrodes 14 and 16 facing each other extend in columnar shapes from the external electrodes 22 and 24 in the thickness direction of the capacitor body 12. Further, these two types of through-hole electrodes 18 and 20 become alternately positive and negative polarities at the time of carrying a current and act as electrodes for the internal electrodes 14 and 16 arranged in parallel in this capacitor.

Further, in the multilayer ceramic chip capacitor 10 according to the present embodiment, for example, since high frequency currents flow in opposite directions to the lands 56 and 58 used in the manner shown in FIG. 4 and arranged three-dimensionally in the board 54, the magnetic fields cancel each other out due to the high frequency currents and the loop inductance of the board 54 is reduced. Further, there is naturally also the effect that the lengths of the lands 56 and 58 become shorter in the three-dimensional board 54.

On the other hand, in the multilayer ceramic chip capacitor 10 as well, since two types of columnar through-hole electrodes 18 and 20 are provided, the above three-dimensional effect is generated of the magnetic fields canceling each other out by the high frequency currents flowing in opposite directions. Further, since positive and negative currents intersect each other two-dimensionally between the two types of internal electrodes 14 and 16, the parasitic inductance of the multilayer ceramic chip capacitor 10 itself is sharply reduced.

Due to the above, in the multilayer ceramic chip capacitor according to the present embodiment, the two types of through-hole electrodes 18 and 20 were made columnar and were alternately connected to the two types of internal electrodes 14 and 16, so that the capacitor was able to be mounted three-dimensionally. Therefore, the loop inductance of the board 54 itself can be reduced three-dimensionally and the parasitic inductance of the multilayer ceramic chip capacitor 10 can be reduced by the effect of the cancellation of the magnetic fields not only two-dimensionally, but also three-dimensionally.

Note that in the past, columnar electrodes have been susceptible to roughening due to problems in production, so that the junctions with the external electrodes became unstable and the ESR easily became larger. Therefore, by making the diameter "D" of the through-hole electrodes 18 and 20 shown in FIG. 1 as large as possible and increasing the number of through-hole electrodes 18 and 20, it is possible to make the junctions more reliable and reduce the ESR. Here, the following Table 1 illustrates the values of the ESR in relation with the diameters "D" and numbers of the through-hole electrodes 18 and 20. Further, the data of Table 1 is that of the case where the thickness of the multilayer ceramic chip capacitor 10 is 0.5 mm.

Table 1 shows the results.

TABLE 1

| Diameter D of through-hole electrode ($\mu$m) | Number | ESR (m$\Omega$) |
| --- | --- | --- |
| 50 | 8 | 12 to 14 |
| 100 | 8 | 3 to 4 |
| 150 | 8 | 1.3 to 1.5 |
| 200 | 8 | 0.7 to 1.0 |
| 250 | 8 | 0.4 to 0.6 |
| 50 | 4 | 25 |
| 100 | 4 | 6 |
| 150 | 4 | 3 |
| 200 | 4 | 1.5 |
| 250 | 4 | 0.8 |
| 50 | 1 | 100 |
| 100 | 1 | 25 |
| 150 | 1 | 11 |
| 200 | 1 | 6 |
| 250 | 1 | 4 |

Here, the degree of heat buildup differs according to the size or frequency of the multilayer ceramic chip capacitor 10, but when the multilayer capacitor becomes higher in clock frequency (for example, 1 GHz or more) and larger in current (20A or more), the ESR of the multilayer ceramic capacitor 10 itself preferably is made less than 1 m$\Omega$.

Therefore, for example, the ESR is estimated by the following:

$$ESR = R + R(f) [\Omega]$$

$$R = \rho*(L/S)*(1/N)[\Omega] \tag{1}$$

where,

R: Resistance of internal electrode ($\Omega$)

R(f): Dielectric loss ($\Omega$) (dependent on ceramic material)

L: Length of through-hole electrode

S: Sectional area of through hole

N: Number of through holes $\rho$: Specific resistance of internal electrode ($\Omega \cdot$m)

When the thickness of the multilayer ceramic chip capacitor is 0.5 mm, from Table 1 and the above equation (1), if the diameter "D" of the through-holes 18 and 20 is made 100 $\mu$m or less so as to make the ESR 1 m$\Omega$ or less, at least 24 through-hole electrodes 18 and 20 are necessary. If the diameter "D" of the through-hole electrodes 18 and 20 is made 150 $\mu$m or less, at least 10 through-hole electrodes 18 and 20 are necessary. If the diameter "D" of the through-hole electrodes 18 and 20 is made 200 $\mu$m or less, at least eight through-hole electrodes 18 and 20 are necessary. Further, if the diameter "D" of the through-hole electrodes 18 and 20 is made 250 $\mu$m or less, just four are enough. To make the ESL lower, however, the number of the through-hole electrodes 18 and 20 should be made greater. Further, the distance "P" between the through-hole electrodes 18 and 20 could be made within 1 mm.

When the thickness of the multilayer ceramic chip capacitor is a thin 0.25 mm, as shown in equation (1), the resistance value also becomes halved. In the case of a thickness of 0.5 mm, the number of through-holes or diameter (area) of the through-hole electrodes can be halved.

Due to the above, from the relation between the number and diameter "D" of the through-hole electrodes 18 and 20 and the ESR, the number of the through holes 18 and 20 is at least six considering the effect of the ESL. If the product thickness is more than 0.2 mm, a diameter "D" of at least 50 μm is necessary. Further, to keep the ESL low, a metal material with a small specific resistance and resistance to shrinkage is desirable as the internal electrodes 14 and 16 and the through-hole electrodes 18 and 20. For example, nickel alone or a nickel alloy is suitable.

Second Embodiment

Next, an explanation will be given of a second embodiment of a multilayer capacitor according to the present invention based on FIG. 5 to FIG. 8. Members the same as members explained in the first embodiment are given the same reference numerals and overlapping explanations are omitted.

Figure 5:
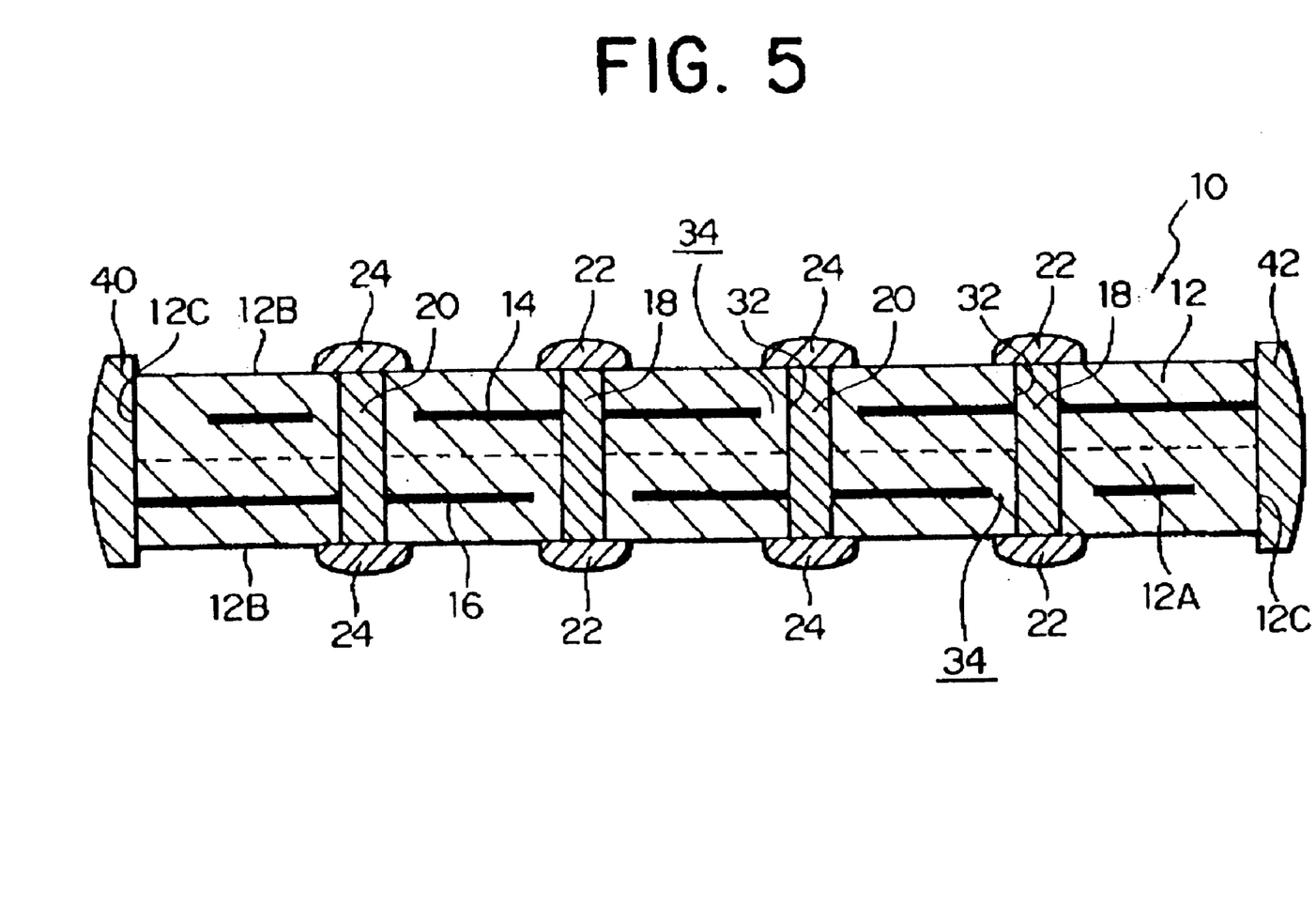
FIG. 5 is a sectional view of a multilayer ceramic chip capacitor according to a second embodiment of the present invention taken along the line V—V of FIG. 7.
Figure 6:
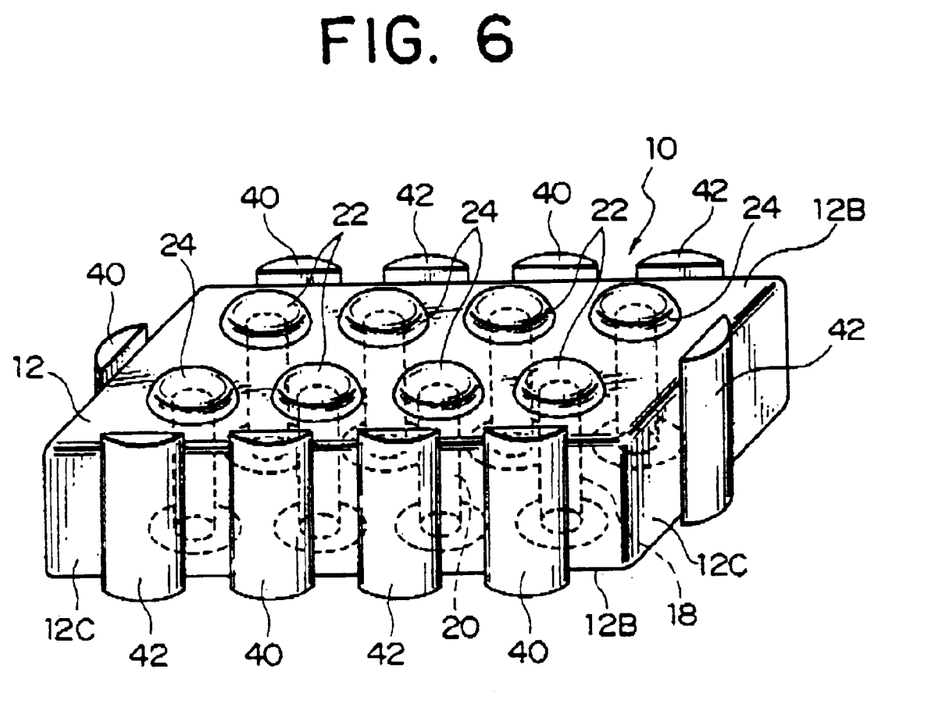
FIG. 6 is a perspective view of the multilayer ceramic chip capacitor according to the second embodiment of the present invention.

The multilayer ceramic chip capacitor 10 according to the second embodiment of the present invention shown in FIG. 5 and FIG. 6 is structured to be a two-dimensionally to three-dimensionally mountable type able to be used mounted two-dimensionally or mounted three-dimensionally.

Figure 7:
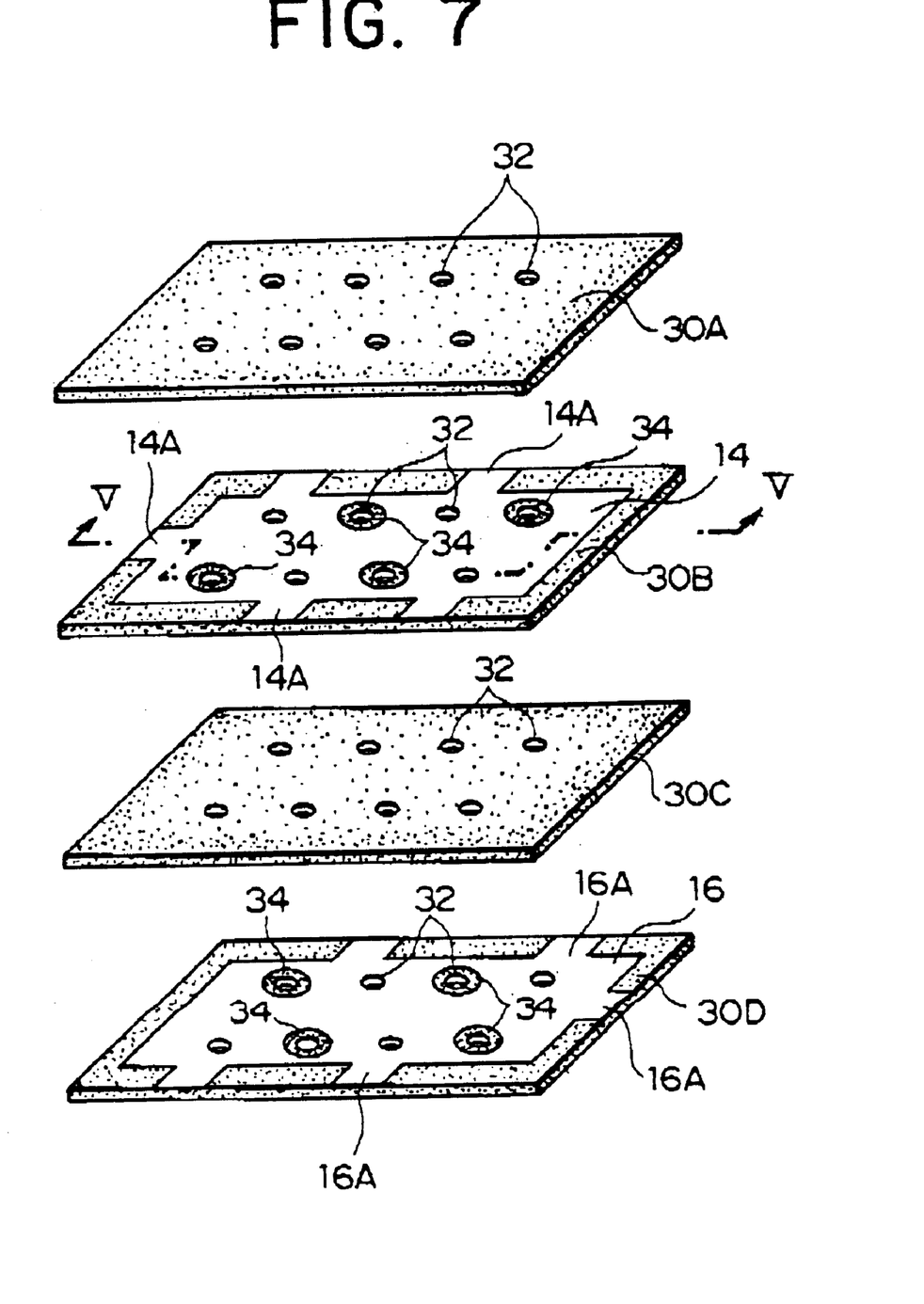
FIG. 7 is a disassembled perspective view showing the plurality of ceramic green sheets and the shapes of the electrodes used in the process of production of the multilayer ceramic chip capacitor of the second embodiment.

That is, as shown in FIG. 7, the leads 14A are formed so that the first internal electrode 14 is led out to one location at the left side face of the ceramic green sheet 30B and led out to two locations each at the front side face and rear side face of the ceramic green sheet 30B.

Further, the leads 16A are formed so that the second internal electrode 16 is led out to one location at the right side face of the ceramic green sheet 30D and led out to two locations each at the front side face and rear side face of the ceramic green sheet 30D at positions not overlapping the first internal electrode 14.

That is, the internal electrodes 14 and 16 facing each other are formed with leads 14A and 16A in a manner inverted 180° from each other. These leads are respectively led out to the three side faces 12C of the hexagonal capacitor body 12. The three side faces 12C at which the leads 14A of the internal electrode 14 are led out and the three side faces 12C at which the leads 16A of the internal electrode 16 are led out overlap only at two side faces and do not overlap at one side face.

Further, in the present embodiment, in the same way as the conventional capacitor array with terminal electrodes arranged at the side faces, the first terminal electrodes 40 connected to the leads 14A of the first internal electrode 14 led out and the second terminal electrodes 42 connected to the leads 16A of the second internal electrode 16 led out are arranged at the four side faces 12C of the capacitor body 12.

Due to the above, in the present embodiment, by forming not only the external electrodes 22 and 24, but also the terminal electrodes 40 and 42, the electrodes are arranged at all of the six faces of the multilayer ceramic chip capacitor 10 made a parallelopiped hexagonal shape.

Next, an explanation will be given of an example of use of the multilayer ceramic chip capacitor 10 using a modification of the embodiment based on FIG. 8.

Figure 8:
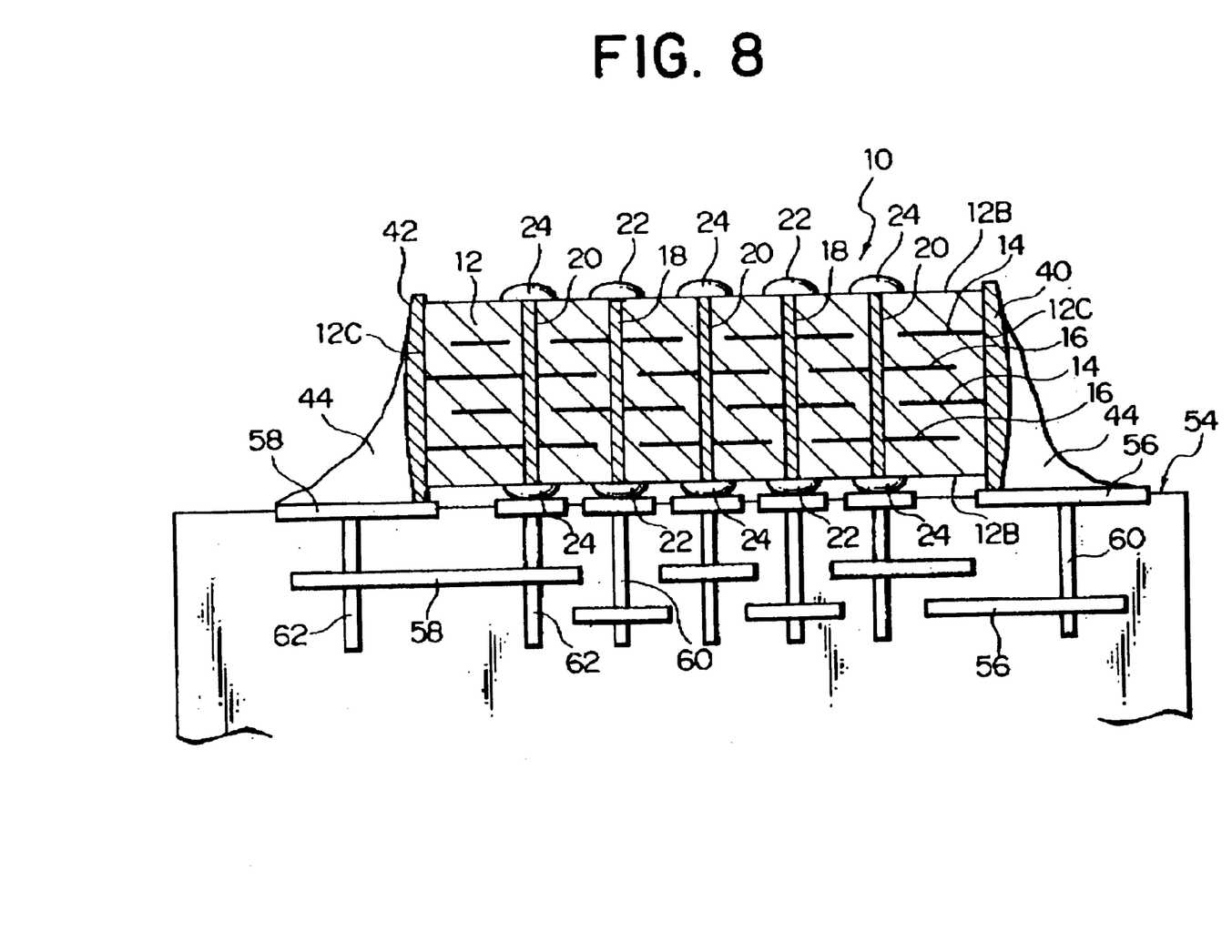
FIG. 8 is a sectional view of the state of use of the multilayer ceramic chip capacitor according to the modification of the second embodiment.

As shown in FIG. 8, the capacitor of this modified embodiment is structured with pairs of the first internal electrodes 14 and the second internal electrodes 16, that is, a total of four internal electrodes 14 and 16, alternately arranged in the capacitor body 12. Further, the arrangement of the first through-hole electrodes 18 and second through-hole electrodes 20 and the arrangement of the first external electrodes 22 and the second external electrodes 24 are similar to the example shown in FIG. 5 to FIG. 7, so explanations are omitted.

Further, the capacitor of the modified embodiment is a two-dimensionally and three-dimensionally mountable type in the same way as the multilayer ceramic chip capacitor 10 shown in FIG. 5 to FIG. 7 and from the product characteristics is used in a form arranged on a multilayer board shown in FIG. 8 as a smoothing capacitor for an IC power source. That is, the multilayer ceramic chip capacitor 10 is arranged on the board 54 by not only connecting the terminal electrodes 40 and 42 of the side faces 12C to the board 54 through the junctions 44 by solder, but also connecting the external electrodes 22 and 24 of the bottom flat portion 12B to the lands 56 and 58.

The IC power source has a not shown Vcc terminal and GND terminal. High frequency currents flow in opposite directions to the lands 56 and 58 arranged in the board 54 three-dimensionally. Further, the first external electrodes 22 and first terminal electrodes 40 are connected to the Vcc terminal through the land 56 and the via-hole 60, while the second external electrodes 24 and second terminal electrodes 42 are connected to the GND terminal through the land 58 and via-hole 62. High frequency currents flow from the Vcc terminal and the GND terminal to the inside of the multilayer ceramic chip capacitor 10.

Next, the action of the multilayer ceramic chip capacitor 10 according to the present embodiment will be explained.

The present embodiment is structured similarly to the first embodiment. In the present embodiment, however, the four side faces 12C of the capacitor body 12 formed in the hexagonal shape are each provided with the terminal electrodes 40 and 42. Further, the first internal electrodes 14 are connected to the first terminal electrodes 40 of three side faces 12C, while the second internal electrodes 16 are connected to the second terminal electrodes 42 of three side faces 12C including the remaining side face 12C.

That is, the facing internal electrodes 14 and 16 are led out to the side faces 12C of the capacitor body 12 with the internal electrodes 14 and 16 inverted for example 180° C. from each other. Further, in the same way as the conventional capacitor array with terminal electrodes arranged at the side faces, the terminal electrodes 40 and 42 are arranged at the side faces 12C of the capacitor body 12 and the internal electrodes 14 and 16 which are led out are connected to the terminal electrodes 40 and 42.

Due to the above, the external electrodes 22 and 24 and the terminal electrodes 40 and 42 are formed on the entire six faces of the rectangular parallelopiped multilayer ceramic chip capacitor 10 and can be mounted not only three-dimensionally, but also mounted two-dimensionally. As a result, when supplying high frequency currents to the terminal electrodes 40 and 42 so that the terminal electrodes 40 and 42 of the side faces 12C become alternately positive and negative and supplying high frequency currents to the two types of external electrodes 22 and 24 so that they become alternately positive and negative, currents of alternatingly opposite directions flow to the columnar through-hole electrodes 18 and 20, the currents intersect so that the internal electrodes 14 and 16 connected to the terminal electrodes 40 and 42 and the through-hole electrodes 18 and 20 become positive and negative polarities, and the parasitic inductance is further reduced as a result.

Therefore, according to the present embodiment, since the terminal electrodes 40 and 42 are provided at the side faces 12C, the ESL can be further reduced from the multilayer ceramic chip capacitor 10 according to the first embodiment.

On the other hand, by leading out the internal electrodes 14 and 16 in the side direction of the multilayer ceramic chip capacitor 10 as in the above embodiment, the ESR also can be made lower. That is, even if the number of the through-hole electrodes 18 and 20 is made not more than six as mentioned above and the diameter is not more than 50 μm, by leading out the internal electrodes 14 and 16 at the side faces 12C and connecting the internal electrodes 14 and 16 to the terminal electrodes 40 and 42, it is possible to make the ESR not more than 1 mΩ. In this case, the effect of the thickness of the product can be ignored.

Figure 9:
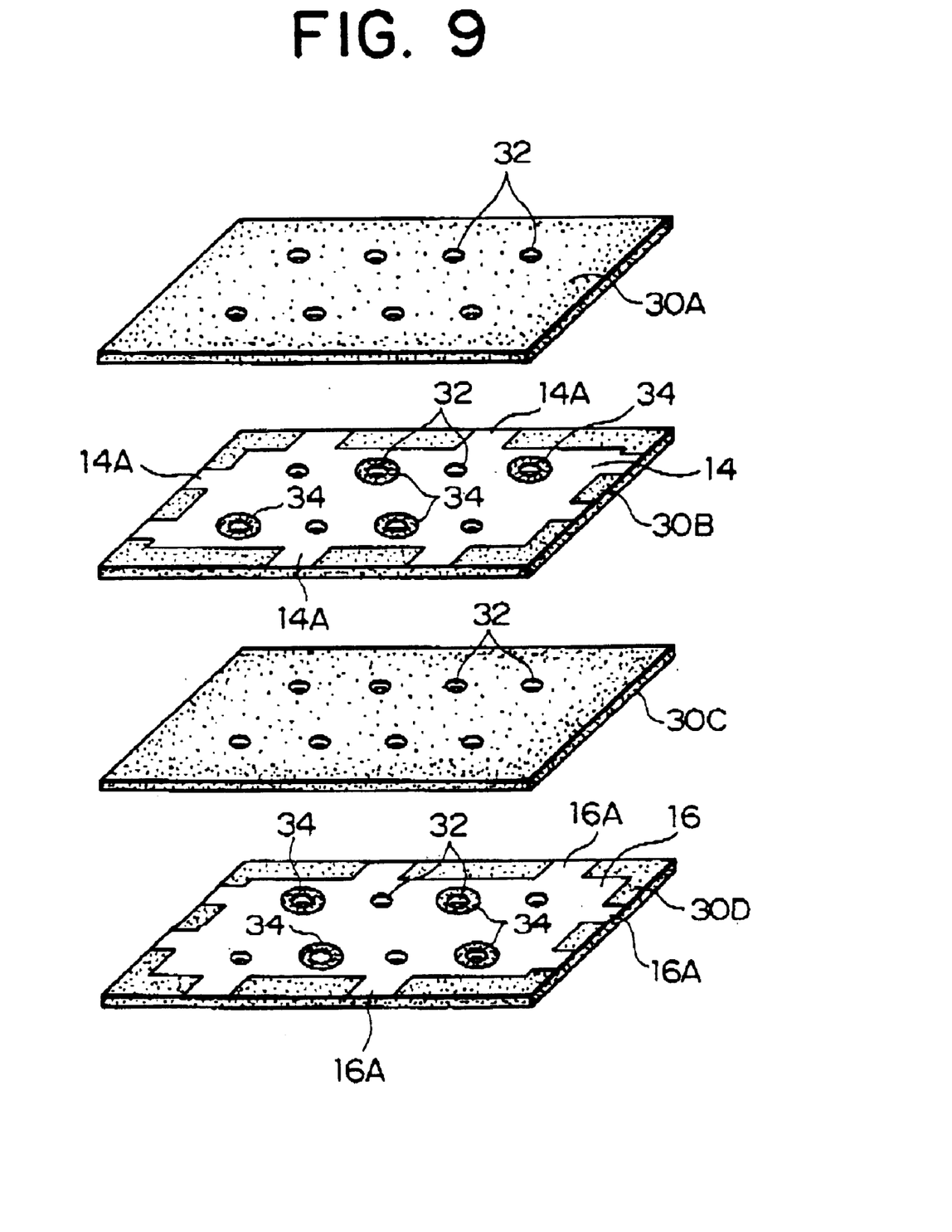
FIG. 9 is a disassembled perspective view showing the plurality of ceramic green sheets and the shapes of the electrodes used in the process of production of the multilayer ceramic chip capacitor according to another modification of the second embodiment.

Further, in the second embodiment, the internal electrodes 14 and 16 facing each other are structured to be lead out to the three side faces 12C of the capacitor body 12, but, as shown in FIG. 9, the first internal electrodes 14 and the second internal electrodes 16 may be connected to be lead out to the four side faces.

Further, in the configuration of the second embodiment, since the loop inductance of the board tends to become large, the method of use should be determined by the size of the board and the arrangement of the devices.

Note that the present invention is not limited to the above-mentioned embodiments and may be changed in various ways within the scope of the present invention.

What is claimed is:

1. A multilayer capacitor comprising:

a planar first internal electrode arranged in a capacitor body formed by stacking at least one or more dielectric layers;

a planar second internal electrode arranged facing the first internal electrode separated by at least one of the dielectric layers in said capacitor body;

a first through-hole electrode connected with said first internal electrode and passing through a second non-contact hole of said second internal electrode while extending to intersect both of the internal electrodes;

a second through-hole electrode connected with said second internal electrode and passing through a first non-contact hole of said first internal electrode while extending to intersect both of the internal electrodes;

first external electrodes connected to said first through-hole electrode and arranged in island shapes on two surfaces of the capacitor body; and second external electrodes connected to said second through-hole electrode and arranged in island shapes on two surfaces of the capacitor body, wherein:

the capacitor body is formed in a hexagonal shape;

first terminal electrodes connected to said first internal electrode are formed at least at three side faces of the capacitor body;

second terminal electrodes connected to said second internal electrode are formed at least at three side faces of the capacitor body, wherein:

a total number of first and second through-hole electrodes is determined by at least one of an inverse relationship of a diameter of the first and the second through-hole electrodes and a thickness of the capacitor body.

2. The multilayer capacitor as set forth in claim 3, where the first external electrodes and second external electrodes are arranged on the surfaces of the capacitor body so that the first external electrodes and the second external electrodes are approximately next to each other.

3. The multilayer capacitor as set forth in claim 2, wherein the thickness of the capacitor body is at least 0.2 mm, the diameter of the first and second through-hole electrodes is at least 50 μm, and the total number of first and second through-hole electrodes is at least six.

4. The multilayer capacitor as set forth in claim 1, wherein the first through-hole electrode and the second through-hole electrode are formed by nickel or a nickel alloy.

5. The multilayer capacitor as set forth in claim 4, wherein the first internal electrode and the second internal electrode are formed by nickel or a nickel alloy.

\* \* \* \* \*